United States Patent [19]

Baran et al.

[11] Patent Number: 4,939,451

[45] Date of Patent: Jul. 3, 1990

[54] WIDE DYNAMIC RANGE A.C. CURRENT SENSOR

[75] Inventors: Paul Baran, Menlo Park; Timothy J. Knutson, San Jose, both of Calif.

[73] Assignee: Metricom, Inc., Campbell, Calif.

[21] Appl. No.: 294,036

[22] Filed: Jan. 6, 1989

Related U.S. Application Data

[62] Division of Ser. No. 88,931, Aug. 24, 1987, Pat. No. 4,835,463.

[51] Int. Cl.[5] ........................ G01R 1/20; G01R 19/00; H01C 7/00

[52] U.S. Cl. .................................... 324/127; 324/126; 338/49

[58] Field of Search ........... 324/126, 127, 142, 117 R; 338/49

[56] References Cited

U.S. PATENT DOCUMENTS

Re. 31,613 6/1984 Lienhard et al. .
1,084,721 1/1914 Willis .
2,818,544 12/1957 McCormack .
2,831,164 4/1958 Johnson .
2,915,707 12/1959 Bradstock et al. .
3,372,334 3/1968 Fenoglio et al. .
3,815,011 6/1974 Milkovic .
3,815,013 6/1974 Milkovic .
4,182,982 1/1980 Wolf et al. .
4,240,059 12/1980 Wolf et al. .
4,492,919 1/1985 Milkovic .
4,506,214 3/1985 Lienhard et al. .
4,513,273 4/1985 Friedl .
4,580,095 4/1986 De Vries .
4,626,778 12/1985 Friedl .
4,628,251 12/1986 Halder .
4,652,810 3/1987 Hayashi .
4,659,981 4/1987 Lumsden .

*Primary Examiner*—Ernest F. Karlsen
*Attorney, Agent, or Firm*—Townsend and Townsend

[57] ABSTRACT

Various combinations of three elements are disclosed for use in accurate measurement of power through current measurement over a wide dynamic range, namely, a current shunt which is preferably an isothermal current shunt, a current transformer, which is preferably a high initial permeability current transformer, and a low-impedance burden load, which in the preferred embodiment includes an active negative impedance element which causes the removal of the effects of excitation current by canceling secondary winding resistance of the current transformer. In a specific embodiment of an isothermal current shunt according to the invention, a very linear device is achieved by construction out of copper in such a manner that the poor resistance versus temperature coefficient of copper does not affect the accuracy of measurement. Specifically, the shunt is constructed in an unbalanced isothermal bridge configuration, so that heat-induced variations are suppressed. Further, a very small current transformer is used having a core optimized for high initial permeability.

9 Claims, 3 Drawing Sheets

WIDE DYNAMIC RANGE A.C. CURRENT SENSOR

This is a division of application Ser. No. 07/088,931 filed Aug. 24, 1987, now Pat. No. 4,835,463.

BACKGROUND OF THE INVENTION

This invention relates to a.c. power measurement in general and more specifically to an apparatus for measuring power by measuring a.c. currents accurately over a wide dynamic range of applied currents.

Known power measurement devices have a relatively limited dynamic range, on the order of 40 to 60 dB. Electric utility companies are not able to account for all of their generated power in a power distribution system at least partially because of the apparent losses attributable to inaccuracy in metering. The dynamic range limitation of conventional power meters means that it is not possible to measure power accurately under both high and low power drain conditions with the same device. There is thus a need to overcome inaccuracies in metering to improve the effectiveness of the electric power distribution system.

Power is the vector product of current and voltage. The dynamic range of the voltage in an electric utility system is generally narrowly limited so that power measurement accuracy thus hinges on the ability to measure a wide range of currents applied to a load.

Power measurement technology has developed three main approaches to measuring current: current transformers, shunts and Hall effect and like devices. Each approach has its limitations. Conventional current transformers exhibit a very limited dynamic range, since they saturate at high currents and lose sensitivity because of limited initial permeability at low currents. Current transformers also tend to saturate with small d.c. current flow caused by half-wave rectified loads, and they exhibit non-linear response because of the magnetizing current which causes amplitude and phase shift errors of the measured currents. Since instantaneous power is the product of instantaneous voltage and instantaneous current, any phase shifts can cause errors.

Shunts, i.e., resistive shunt measuring devices, also tend to have a very narrow dynamic range. Although measured voltage drop is proportional to current, heating is proportional to the square of the current. Hence, shunts tend to waste power and can overheat to the point of destruction in a wide dynamic range environment. Another restriction is that a shunt measuring circuit must be at the same potential as the shunt. This restriction makes it awkward to measure two simultaneous currents, as for example in 120/240 volt circuits where each is at a different potential.

Other electronic sensors, such as Hall effect devices tend to exhibit marked temperature sensitivity and provide limited long-term stability. This again is a limitation for many applications. Again, the measuring devices must be maintained at the same potential as the circuit to be measured, which limits their usefulness in electric utility system applications.

It is known that reducing the terminating resistance of a current transformer reduces the deleterious effects caused by magnetizing current, since the power load or burden seen by the transformer is reduced as load impedance is reduced. However, as the resistance of a conventional current transformer is reduced, the voltage output (which one desires to measure) is also reduced, so that a compromise is required in practice between the desire to obtain sufficient signal to overcome background noise and the desire to provide as low a "burden resistance" to the current transformer as possible in order to minimize the deleterious effects of phase and amplitude distortion in a current transformer circuit. In practice, the burden cannot be set to zero because the secondary winding resistance is an integral part of the burden.

The following patents were reviewed in the course of an investigation of the patent literature with respect to the present invention:

Milkovic U.S. Pat. No. 4,492,919 describes a three-path low impedance current sensor with an active load for measuring high amplitude currents. The feature emphasized is a meander leg forming the shunt, the shunt itself sharing common input and output nodes with the current legs. Also disclosed is an active circuit for sensing current, but the active circuit fails to take into account the effects of secondary resistance and thermal imbalance have upon operation of a meter over a wide dynamic range.

Wolf et al. U.S. Pat. No. 4,240,059 describes a recent shunt-type current divider for sensing current through a flat disk or sheet wherein the shunt paths are transverse of the main current legs and of different length. Significantly, the shunt is formed integrally with the legs. The invention in this patent is not suitable for applications employing a prewound toroidal core mounted on the shunt. Nor does it effectively balance out hum pickup. The integral structure renders it impossible to mount a closed toroid on the shunt. The shunt is not circular in cross section and could not be manufactured to be so in the disclosed embodiment.

Other patents of interest were also uncovered. Some of these patents were references to the foregoing patents.

McCormack, U.S. Pat. No. 2,818,544 is an early patent which describes the concept of zero impedance load circuits. However, the structures disclosed therein fail to show or suggest structures of the type described in connection with the present invention.

Johnson, U.S. Pat. No. 2,831,164 describes a toroidal transformer apparatus. It teaches a type of current divider to control the effective ratio of a current transformer with a toroidal core.

Bradstock et al. U.S. Pat. No. 2,915,707 describes a current measuring reactor arrangement for measuring current in a bus bar. Specifically, this patent discloses a three path arrangement wherein all current flows between nodes common to all three legs. The tow low impedance legs are equal in length and enclose dual toroidal cores on the central conductor. However, a primary teaching of this patent is the use of a dividing current shunt which balances out the field to reduce hum pickup.

Wolf et al. U.S. Pat. No. 4,182,982 brought some of the early concepts up to date with the combined use of two separate secondary windings and an electronic amplifier.

U.S. Pat. No. 3,372,334 to Fenoglio et al. describes still another current shunt arrangement. In particular this patent describes a dividing shunt.

Friedl U.S. Pat. No. 4,513,273 describes a specific structure for a current transformer and differential current shunt. It teaches about the geometry of differential resistors. It also employs an active element (an amplifier) having a first secondary winding as a sensor and driving a second secondary winding in series with a load.

De Vries U.S. Pat. No. 4,580,095 describes a specific structure for a current divider. This patent is representative of a class of current dividers which would be considered unsuited to use with the present invention.

Friedl U.S. Pat. No. 4,626,778 describes an active current sensor and structure. The disclosure is similar to that of the '273 patent.

Halder U.S. Pat. No. 4,628,251 describes a voltage transducer in connection with an active circuit. The current transformer employs multiple windings. The active circuit employs an active impedance transformer, specifically a voltage buffer, to drive an operational amplifier. Nothing seems to suggest attention to correction of the problem of secondary winding resistance in the context of current measurement.

Willis, U.S. Pat. No. 1,084,721, describes an early design for a shunt used in a measuring instrument.

Lienhard, U.S. Pat. No. Re. 31,613, describes various embodiments of measuring transformers and cores.

Lienhard, U.S. Pat. No. 4,506,214, describes various embodiments of measuring transformers and cores.

All of these references describe apparatus applying approaches distinguishable from the present invention in the context of the desire to measure a.c. current over a wide dynamic range. A power meter is nevertheless needed, and more particularly, a current measuring device is needed which is capable of accurate measurement of current over a wide dynamic range, on the order of 100 dB.

SUMMARY OF THE INVENTION

According to the invention, a wide dynamic range current sensor for use in power measuring circuits and particularly for customers of electric utility companies comprises in combination an isothermal current shunt forming the primary of a current transformer whose secondary winding equivalent circuit terminates into a measuring circuit which appears to the secondary of the current transformer as a dead short. The only burden in the secondary circuit is the winding resistance of the secondary winding, the effect of which is removed by the combination of an active current-to-voltage converter circuit coupled in series with an amplifier having an amplification factor equal to the complement of the amplification factor of the current-to-voltage converter. The converter and the amplifier are together coupled in series with the secondary winding. The measuring circuit receives its signal from the output of the active current to voltage converter. The negative impedance is chosen to be substantially equal to the winding resistance of the secondary circuit.

It is necessary to reduce the large currents found in practice to levels which can be handled by standard commercial grade operational amplifier circuits. This is done according to the invention by forming the isothermal current shunt of a pair of equal-length copper bars coupled together at a first or input node and at a second or output node and having as the shunt a removable copper rod (with circular cross section) disposed between the bars to form the primary of a toroidal current transformer, the distance between the input node to the first terminal of the rod being different than the distance between the input node to the second terminal of the rod, thereby to form an unbalanced bridge. The two equal length copper bars are formed to be parallel to each other and to the hole through the center of the toroidal current transformer. This minimizes the distance between the copper bars to minimize temperature differentials while the parallel structure minimizes extraneous field pickup.

According to the invention one or both of the two principal concepts are used together to improve the useful dynamic range of a.c. current measurement as an indication of power. The first concept is the use of a low resistance isothermal current ratio shunt wherein only part of the current which passes through the shunt is used by the measuring circuit, and wherein the geometry allows use with a low leakage inductance toroid and avoids creating undesired unbalanced field pickup.

The second concept is use of an electrically stable, thermally balanced negative impedance burden to effectively reduce the exciting current to near zero thereby eliminating the effects of the winding resistance plus its burden resistor on the measurement.

The first concept provides a reduction of the current to be measured to a value which can be conveniently handled by conventional electronic circuitry, while the second concept minimizes errors which would be introduced by exciting current factors that limit the accuracy of previously-known current measurement devices at low current values.

A specific embodiment of the invention combines three concepts, namely, an isothermal unbalanced transverse current shunt capable of fitting within a core hole, a high initial permeability current transformer, and a negative impedance burden. The isothermal current shunt reduces current through the current transformer by a factor of fifty and provides a very low impedance path to the power flow (typically in the range of 17 microOhm) and thus operates without excessive heating even when measuring very high current (e.g., over 200 Ampere). The isothermal current shunt according to the invention is a very linear device. It is preferably constructed of copper in such a manner that the high resistance versus temperature coefficient of copper does not affect the accuracy of measurement. Specifically, the shunt is constructed in an isothermal configuration, so that the current dividing ratio is not affected by heat-induced variations. The shunt uses a removable round copper slug of minimum length that fits within the core of a very small current transformer without an air gap and optimized for highest initial permeability. A higher quality magnetic material, such as hydrogen strain relieved supermalloy or other high initial permeability ferrites can be used in lieu of the more common and less ideal core material usually employed for a large current transformer core. The current carrying bars are parallel to the hole in the core to minimize hum pickup, and the short length of the copper slug minimizes the temperature gradient between the two parallel bars.

The combination of an isothermal shunt plus the high ratio, high initial permeability current transformer (current step-down preselected in the range of 1000–5000:1) thus linearly reduces the current level to a range which can be handled readily by widely-available electronic signal processing devices.

Rather than confront the usual trade-off between the desire to minimize transformer burden and the need to obtain an adequately measurable output voltage representative of the shunt current, this invention provides a zero impedance current measuring circuit using an active current detector, such as a current-to-voltage converter with amplification built around an operational amplifier, the output of which providing a high gain output. To remove the residual secondary winding impedance in accordance with the present invention, the secondary circuit of the current transformer is provided with a negative impedance selected to balance out the winding impedance on the measured quantity, so that the secondary circuit in effect appears as a dead short load, regardless of the secondary winding impedance. As a result, the magnetizing current impairments effectively disappear. Hence only the voltage generated at the output of the secondary circuit is measured, while the negative impedance provides the factor which is required to create the illusion of zero impedance. For this reason, the negative impedance is set exactly equal to the secondary winding impedance (typically a pure resistance).

To inhibit undesired oscillation of the detection circuit, the product of the amplification factors of the active elements is set to less than 1.0.

This invention expands the useable dynamic range of accurate current measurement to over 100 dB (1mA to 200 A) in a 60 Hz domestic power mains application with virtually no distortion introduced by phase or amplitude error and greatly reduced sensitivity to d.c. current errors. For this reason this invention is expected to have wide commercial application for measuring power.

DESCRIPTION OF SPECIFIC EMBODIMENTS

Figure 1:
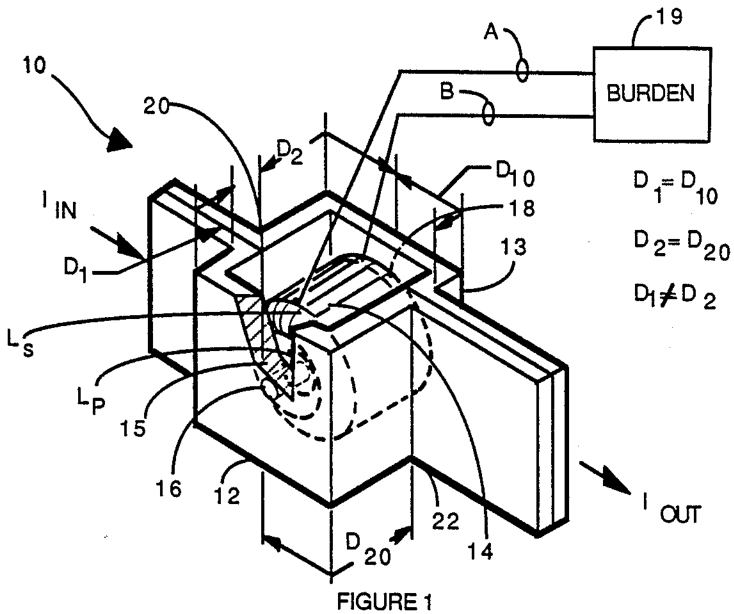
Figure 1 is a perspective view of a power measuring apparatus in accordance with one specific embodiment of the invention.
Figure 2:
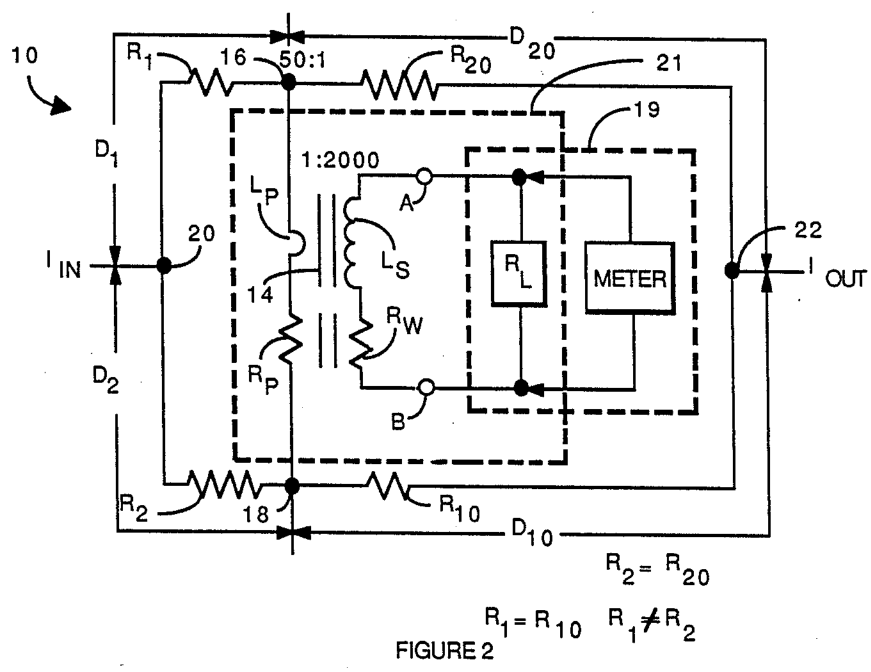
FIG. 2 is a schematic diagram of an apparatus in accordance with the invention and which includes the structure of FIG. 1.

FIG. 1 illustrates in perspective a specific embodiment of a power measuring apparatus 10 in accordance with the invention, and FIG. 2 illustrates the circuit in schematic form. The power measuring apparatus 10 comprises in combination a first bus bar 12 preferably of copper having resistance $R_1+R_{20}$ and a second bus bar 13 constructed of the same material and having the same cross-section as the first bus bar 12 with resistance $R_2+R_{10}$ equal to $R_1+R_{20}$.

The bus bars 12 and 13 are isothermal and are bonded to one another and form an open cavity therebetween enclosing within the cavity a very small elongate toroidal core 14 having wound thereon a secondary winding $L_S$ with a winding resistance $R_W$ whose terminals A, B terminate in a burden 19. A shunt rod 15, of the same material as the bus bars 12, 13 and as short as practical, forms a single-loop primary winding $L_P$ having winding resistance $R_P$ and extends through the cavity and the center of the toroid 14 between a first post position 16 in the first bus bar 12 and a second post position 18 in the second bus bar 13. The ratio of the cross section of the first bus bar 12 or second bus bar 13 to the cross section of the shunt rod 15 is proportional to the current step down. The bus bars 12, 13, which may be of a width dimension in excess of the diameter of the toroidal core 15, are joined at a first current node 20 and at a second current node 22, the first current node 20 being the input node of the input current $I_{IN}$ to be measured and the second current node 22 being the output node for the measured current $I_{OUT}$. In accordance with the invention the output current $I_{OUT}$ approaches the ideal of being virtually equal to the input current by virtue of the zero impedance of the burden 19.

The length of the first input current path $D_1$ through the first bus bar 12 from the first current node 20 to the first post position 16 is significantly less than the length of the second input current path $D_2$ through the second bus bar 13 from the first current node 20 to the second post position 18. The length of the first output current path $D_{20}$ through the first bus bar 12 from the first post position 16 to the second current node 22 is significantly greater than the length of the second output current path $D_{10}$ through the second bus bar 13 from the second post position 18 to the output current node 22. However, the length of the first input current path $D_1$ is equal to the length of the second output current path $D_{10}$, and the length of the second input current path $D_2$ is equal to the length of the first output current path $D_{20}$, so that the total length of the first current path $D_1+D_{20}$ from input node 20 to output node 22 is equal to the total length of the first current path $D_2+D_{10}$ from input node 20 to output node 22, whereas the total length of the first sensor current path from the input node 20 via the first input current path $D_1$, the primary $L_P$ and the second output current path $D_{10}$ to the output node 22 is significantly less than the total length of the second sensor current path from the input node 20 via the first second current path $D_2$, the primary $L_P$ and the second output current path $D_{20}$ to the output current node 22. Therefore the path resistance $R_1+R_{20}$ of the first sensor current path $D_1+D_{20}$ is less than the path resistance $R_2+R_{10}$ of the second sensor current path $D_2+D_{10}$, thus forming a resistor divider across the primary $L_p$ with resistance $R_p$ and a differential in voltage between first terminal position 16 and second terminal position 18 which promotes current flow in a single direction through the primary $L_p$ while at the same time balancing the current flow and thermal load between the first current path $D_1$, $D_{20}$ and the second current path $D_2$, $D_{10}$.

The current differential through the shunt $L_P$ is selected preferably to approximately 50:1, but any calibrated value is suitable. In summary, the invention provides in combination a thermally balanced offset shunt wherein the shunt forms a primary of a current measuring transformer, the burden of the current measuring transformer having a virtually zero impedance.

Importantly, the current carrying bars 12 and 13 have a widest dimension which is wider than the diameter of the toroidal core 14 and the walls of the current carrying bars 12 and 13 are parallel to the rod 15 on the axis of the toroidal core 14. This configuration tends to minimize hum pickup. Other geometric features of the invention are apparent from the illustration.

A review of the operation of current transformers is helpful to the understanding of the present invention. Current transformers operate by creating a flux in their primaries which is counterbalanced by a bucking or counter EMF field of their secondaries with their associated current. An exciting current is caused by the imperfect magnetic properties of the core in delivering power to the secondary and is the vector difference between the primary and the secondary currents, corrected for the turns ratio. By reducing the output power taken to zero by the zero impedance burden, the balance becomes nearly perfect, as in the present invention, and thus the core of the transformer runs essentially unsaturated, and the deleterious effects of exciting current are removed.

Figure 3:
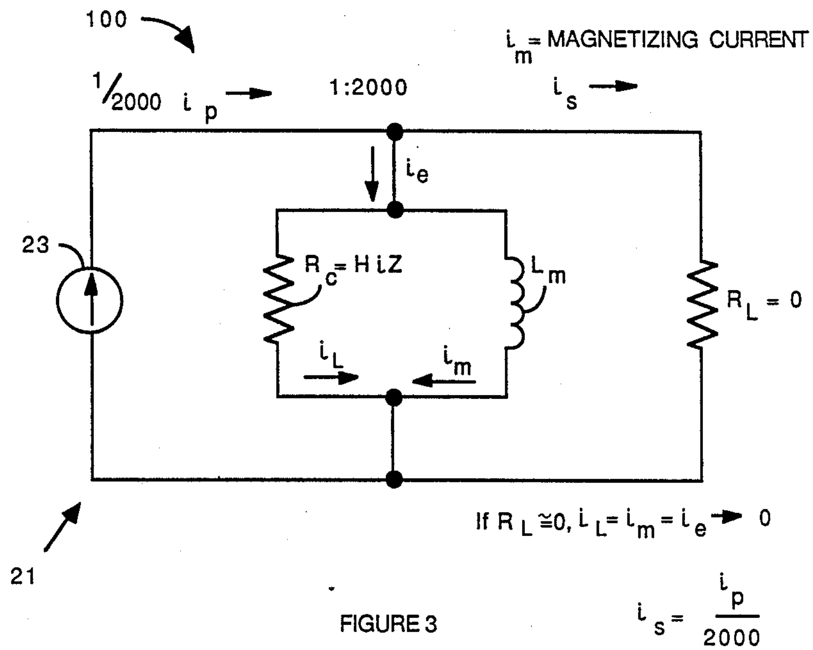
FIG. 3 is an equivalent circuit schematic diagram of an ideal current sensor in accordance with the invention.

This may be considered in terms of the equivalent circuit 100 shown in FIG. 3. A sensing circuit 21 is represented by a current source 23 and a primary current $i_p$. For a current step-down of 2000 (from the primary to secondary winding ratio of 1:2000), the equivalent primary current $i_p$ is the equivalent stepped-down version of the true current $i_P$ actually flowing through the primary winding (not shown). (In a specific embodiment, the transformer step-down ratio is between about 1000:1 and 5000:1 and preferably is preselected to a value placing the range of currents within the dynamic range of electronic instrumentation monitoring the output, or about 2000:1). In FIG. 3, an electronic burden (or burden load) $R_L$ representing the impedance in a transformer secondary appears as a short, i.e., $R_L=0$. The (stepped-down) current in the primary of the transformer $i_p$ must equal the secondary current $i_s$ plus the excitation current $i_e$ in the equivalent sensing circuit 21, i.e. $i_p=i_s+i_e$. By making the burden load $R_L$ in the secondary path appear to be zero (a dead short), the primary current $i_p$ must equal the secondary current $i_s$. The loading of the core must be essentially zero, since the core resistance $R_c$ and magnetizing inductance $L_m$ are non-zero in comparison with $R_L$, so that portion of the primary current that excites the core must be zero.

This arrangement has considerable favorable effects in a measuring circuit. First of all, it means that the dilemma of the choice of core material can be solved. No longer is it necessary to limit the choice of core to large cross sections and materials having high permeability at high current densities. Higher quality materials, such as hydrogen strain relieved supermalloy, may be used economically in smaller cores with lower losses, and yet the smaller cores can carry higher currents and remain wholly responsive to minuscule currents, thus dramatically extending the dynamic range of current measuring devices.

Figure 4:
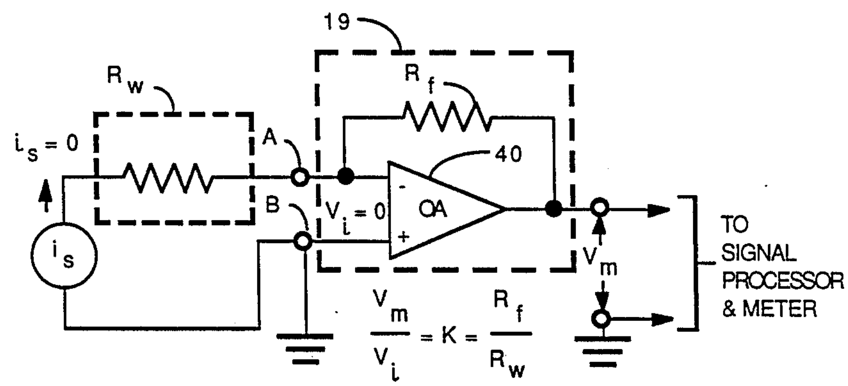
FIG. 4 is a schematic diagram of a first current to voltage converter means in accordance with the invention.
Figure 5:
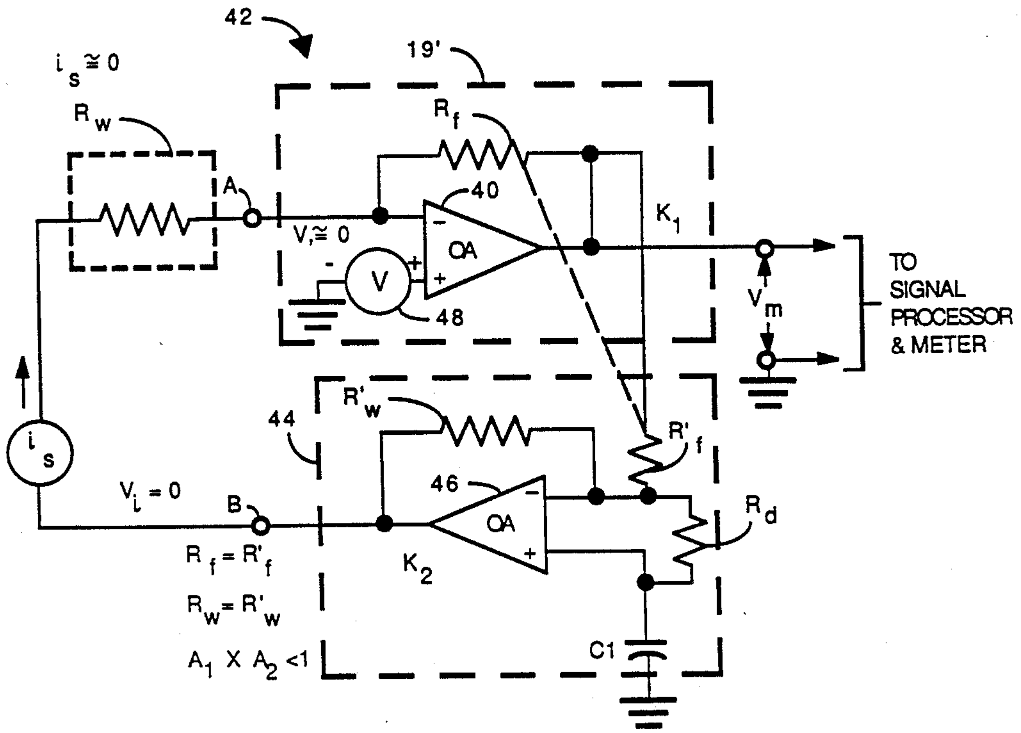
FIG. 5 is a schematic diagram of a second current to voltage converter means in accordance with the invention incorporating an active negative impedance means.

FIG. 4 and FIG. 5 show types of circuits used to provide the near perfect zero impedance load. The circuit of FIG. 4 is used to explain general principles. FIG. 5 illustrates a specific embodiment of the invention.

Referring to FIG. 4, in connection with FIG. 2, there is shown a current to voltage converter in which no negative feedback resistance network is employed. While this type of measurement configuration is functional, there are inherent limitations. Specifically, it can be shown that the absence of an impedance component for cancellation of the effects of winding resistance makes it difficult, and in fact virtually impossible, to obtain an accurate current reading over a broad dynamic range using a shunt arrangement, especially if a linear transfer characteristic is assumed. This is because the resistance of the secondary of the current transformer to increase the effective resistance of the shunt $L_P$ as seen across the bridge formed by resistances $R_1$ and $R_2$ (FIG. 2).

Referring to FIG. 4, the secondary current $i_s$ is depicted as a current source, which is equal to virtually zero. The secondary current is applied through the winding resistance $R_w$ between a terminal B and a terminal A of the burden 19 The burden in this embodiment is a first operational amplifier OA 40 having coupled between its output and its inverting input at terminal A a feedback resistor $R_f$. As is well known, a perfect operational amplifier has infinite input impedance and produces a virtual ground at its input node. The voltage amplification factor K is the ratio of the value of the feedback resistance $R_f$ to the value of the winding resistance $R_w$. Any current through the winding resistance $R_w$ causes a voltage drop $V_i$ at terminal A relative to terminal B. A change in the input voltage $V_i$ causes a corresponding change in the output or meter voltage $V_m$ multiplied by the amplification factor K.

Referring now to FIG. 5, there is shown a preferred embodiment of a secondary circuit 42 of power measuring apparatus 10 according to the invention. As before, the secondary current $i_s$ is applied through the winding resistance $R_w$ between a terminal B and a terminal A of the burden 19. The burden in this embodiment is a first operational amplifier OA 40 having coupled between its output and its inverting input at terminal A a first feedback resistor $R_f$. A first voltage amplification factor $K_1$ is the ratio of the value of the first feedback resistance $R_f$ to the value of the winding resistance $R_w$. Any current through the winding resistance $R_w$ causes a voltage drop $V_i$ at terminal A relative to terminal B. A change in the input voltage $V_i$ causes a corresponding change in the output or meter voltage $V_m$ multiplied by the amplification factor $K_1$. However, according to the invention, the deleterious effects of winding resistance as described in connection with FIG. 3 are eliminated by applying a suitable negative impedance by means of an active negative impedance element 44 connected in series with the secondary current $i_s$. The value of suitable negative impedance is selected to cancel the winding resistance, thereby to present a zero resistance burden as seen at the terminals A, B. If there is a zero resistance burden, then the effects of magnetizing currents in the transformer formed around the toroidal core 14 are eliminated and accurate current measurements can be taken.

In the specific embodiment of FIG. 5, the active negative impedance element 44 is a second operational amplifier 46 having a winding feedback resistor $R_{w'}$ coupled between its output and its inverting input, where the feedback resistor $R_{w'}$ has a value chosen to match the winding resistance $R_w$, as explained hereinbelow. There is also an input resistor $R_{f'}$ which is coupled between the output node of the first operational amplifier 40 and the input node of the second operational amplifier 46, the value of which is selected to establish the amplification factor $K_2$ of the second operational amplifier 46. The first feedback resistor $K_1$ and the second feedback resistor $K_2$ are preferably packaged together in an isothermal unit so that their resistance values track each other in with changes in ambient temperature.

The range of values of the resistances is important. If for example, the nominal winding resistance $R_w$ of the winding has a value of between 102.9 and 104.9 Ohms (2000 turns of #36 copper wire), then the value of the winding feedback resistor $R_{w'}$ should be between 42.27 and 43.13 Ohms, at 20 degrees C., and it should be a copper resistor. The amplification factor $K_1$ of the burden 19' may be about 7, and therefore the value of the feedback resistance $R_f$ should be about 750 Ohms. In order to avoid oscillation, the product of the amplification factors $K_1 \times K_2 = A$ should be less than 1.00 under all conditions. Selection of a value of 0.95 for A and solving the algebra dictates that the value of the input resistor $R_f$ should be 324 Ohms.

Certain enhancements may be added to the secondary circuit 42 to improve operational convenience. It may for example be helpful to provide a center bias reference voltage 48 at the input node of the noninverting input of the first operational amplifier 40. Still further, it may be prudent to provide feedback for any operational amplifier drift d.c. offset. To this end, an offset correction resistor $R_d$ of a relatively large value (1 MegOhm) may be coupled across the inputs of the second operational amplifier 46, and a storage capacitor $C_1$ may be coupled between the noninverting input node of the second operational amplifier 46 in connection with one terminal of the offset correction resistor $R_d$. The storage capacitor $C_1$ should be of a relatively large value, such as about 22 microFarads, to maintain an offset voltage with a long time constant.

The invention has now been explained with reference to specific embodiments. Other embodiments will be apparent to those of ordinary skill in the art in view of this description. It is therefore not intended that this invention be limited, except as indicated by the appended claims.

We claim:

1. An apparatus for providing an isothermal current shunt, said isothermal current shunt comprising:

a current transformer having a primary and a secondary;

separate first and second solid conductive bars of equal length, said first and second bars being electrically and thermally coupled at a first or current input node and at a second or current output node; and a separate third round solid conductive bar electrically and thermally coupled to said first bar at a first hole at a third node and to said second bar at a second hole at a fourth node to form the primary of said current transformer, said third bar being constructed of the same material as said first and second bars, the length between said input current node and said third node being different than the length between said input current node and said fourth node, and the length between said output current node and said third node being equal to the length between said input current node and said fourth node, and wherein said current transformer comprises a core formed of a toroid mounted around said third bar and between said first bar and said second bar;

thereby to form an unbalanced bridge with a current transformer at the shunt.

2. The apparatus according to claim 1 further including an electronic amplifying means comprising a first operational amplifier and a first impedance means in a negative feedback loop for said first operational amplifier wherein amplification of said amplifying means is substantially equal to the ratio of the impedance value of said first impedance means and the impedance value of winding resistance of said secondary.

3. The apparatus according to claim 1 wherein said burden load impedance is formed by a series connection of said secondary, a first electronic amplifying means and a second electronic amplifying means, said first electronic amplifying means having an amplification factor at least in part determined by the value of winding resistance of said secondary.

4. The apparatus according to claim 3 wherein said secondary has a first terminal and a second terminal and wherein said first electronic amplifying means is coupled to present as a load to said secondary at said first terminal a high impedance at a first input terminal of said first electronic amplifying means, and further wherein said first electronic amplifying means is coupled in series with a second input terminal of said second electronic amplifying means, the output terminal of said second electronic amplifying means being coupled to said second terminal, said second electronic amplifying means having an amplification factor equal to the complement of the amplification factor of said first electronic amplifying means, thereby to present a negative impedance to said secondary removing effects of said secondary winding resistance.

5. The apparatus according to claim 4 wherein said second electronic amplifying means comprises a second operational amplifier and a second impedance means in a negative feedback loop for said second operational amplifier, said second impedance means being formed of a material having a temperature to resistance coefficient equal to said secondary winding and is disposed in isothermal relationship to said secondary winding thereby to minimize heat-induced differences in resistance between said secondary winding resistance and said second impedance.

6. The apparatus according to claim 4 wherein said current transformer further comprises a core formed of a material having high initial permeability.

7. An apparatus for providing an osothermal current shunt, said isothermal current shunt comprising:

a current transformer having a primary and a secondary;

first and second solid conductive bars of equal length, said first and second bars being electrically and thermally coupled t a first or current input node and at a second or current output node; and a third round solid conductive bar electrically and thermally coupled to said first bar at a first hole at a third node and to said second bar at a second hole at a fourth node to form the primary of said current transformer, said third bar being constructed of the same material as said first and second bars, the length between said input current node and said third node being different than the length between said input current node and said fourth node, and the length between said output current node and said third node being equal to the length between said input current node and said fourth node, and wherein said current transformer comprises a core formed of a toroid mounted around said third bar and between said first bar and said second bar;

wherein a burden load impedance is formed by a series connection of said secondary, a first electronic amplifying means and a second electronic amplifying means, said first electronic amplifying means having an amplification factor at least in part determined by the value of winding resistance of said secondary;

thereby to form an unbalanced bridge with a current transformer at the shunt; and wherein said secondary has a first terminal and a second terminal and wherein said first electronic amplifying means is coupled to present as a load to said secondary at said first terminal a high impedance at a first input terminal of said first electronic amplifying means, and further wherein said first electronic amplifying means is coupled in series with a second input terminal of said second electronic amplifying means, the output terminal of said second electronic amplifying means being coupled to said second terminal, said second electronic amplifying means having an amplification factor equal to the complement of the amplification factor of said first electronic amplifying means, thereby to present a negative impedance to said secondary removing effects of said secondary winding resistance.

8. The apparatus according to claim 7, wherein said second electronic amplifying means comprises a second operational amplifier and a second impedance means in a negative feedback loop for said second operational amplifier, said second impedance means being formed of a material having a temperature to resistance coefficient equal to said secondary winding and is disposed in isothermal relationship to said secondary winding thereby to minimize heat-induced differences in resistance between said secondary winding resistance and said second impedance.

9. The apparatus according to claim 7, wherein said current transformer further comprises a core formed of a material having high initial permeability.

* * * * *